United States Patent

Boelke

[15] 3,694,766

[45] Sept. 26, 1972

[54] FREQUENCY SYNTHESIZER APPARATUS

[72] Inventor: Gilbert L. Boelke, West Seneca, N.Y.

[73] Assignee: GTE Sylvania Incorporated

[22] Filed: Aug. 30, 1971

[21] Appl. No.: 175,839

[52] U.S. Cl. ........................331/11, 331/19, 331/25, 331/40, 331/44

[51] Int. Cl. ..........................H03b 3/04, H03b 21/00

[58] Field of Search ............................331/10–12, 19, 331/25, 37, 40, 44

[56] References Cited

UNITED STATES PATENTS

| | | | |
|---|---|---|---|
| 2,581,594 | 1/1952 | MacSorley | 331/11 X |
| 2,810,832 | 10/1957 | Broadhead, Jr. | 331/11 |

*Primary Examiner*—Roy Lake
*Assistant Examiner*—Siegfried H. Grimm
*Attorney*—Norman J. O'Malley et al.

[57] ABSTRACT

Harmonic generator type of frequency synthesizer employing a reference frequency signal equal to the spacing between adjacent channels and a displaced reference frequency signal which differs from the reference frequency by a few hertz. The reference frequency signal is applied to a first harmonic generator which generates a spectrum of harmonics of the reference frequency. The spectrum is applied to a phase-locked loop which produces an output frequency signal equal to a particular one of the harmonics of the reference frequency. The displaced reference frequency signal is applied to a second harmonic generator which generates a spectrum of harmonics of the displaced reference frequency. The spectrum of harmonics of the displaced reference frequency is combined with the output signal of the phase-locked loop in a mixer and the output of the mixer is applied to a low-pass filter. The frequency of the only output signal from the filter is equal to the same particular harmonic to which the phase-locked loop is locked times the difference in frequency between the reference frequency and the displaced reference frequency. Since the difference between the frequencies is a known, fixed value, the signal from the filter is thus a precise measure of the particular harmonic of the reference frequency being produced by the phase-locked loop.

The output frequency of the filter may be counted and compared with a preset count representing the value of a predetermined harmonic of the reference frequency to which it is desired to tune the phase-locked loop. The difference between the counts is employed to generate a voltage signal which is coupled to the phase-locked loop to change the tuning of the phase-locked loop to another harmonic of the reference frequency.

9 Claims, 3 Drawing Figures

PATENTED SEP 26 1972

3,694,766

FREQUENCY SYNTHESIZER APPARATUS

BACKGROUND OF THE INVENTION

This invention relates to frequency synthesizer apparatus. More particularly, it is concerned with harmonic generator types of frequency synthesizers and with arrangements for ensuring their operation at the frequency desired.

In known harmonic generator types of frequency synthesizers, the output of a frequency source is divided to obtain a reference frequency equal to the spacing desired between adjacent channels. The reference frequency from the divider is applied to a harmonic generator which generates a spectrum containing a plurality of harmonics, or multiples, of the reference frequency. The output of the harmonic generator is applied to a phase detector of a phase-locked loop which includes a voltage controlled oscillator and operates in a known manner to produce an output frequency which is equal to one of the harmonics of the reference frequency.

Although known systems of this type are capable of synthesizing a wide range of frequencies, it is difficult to determine the specific channel, or harmonic of the reference frequency, to which the phase-locked loop is tuned. One technique employs programmable digital frequency dividers to divide the output frequency of the phase-locked loop by a number which will produce the reference frequency if the phase-locked loop is locked to the proper channel. The resulting frequency is compared to the reference frequency and the phase-locked loop is re-tuned if there is a difference. Considerable DC primary power is required in this technique to operate high speed frequency dividers.

Another conventional approach is to tune the phase-locked loop by starting from a known frequency and sweeping through channels while counting the channels swept through until the desired harmonic number is reached. However, a miscount or a transient disturbance which causes the phase-locked loop to unlock and re-lock on a different channel can occur without providing an indication, thereby causing the system inadvertently to be tuned to an incorrect channel.

SUMMARY OF THE INVENTION

Frequency synthesizer apparatus in accordance with the present invention includes an arrangement permitting identification and verification of the channel, or the harmonic of the reference frequency, to which the phase-locked loop is tuned. In addition, in certain embodiments the system is automatically fine tuned ensuring that it remains locked at the intended channel.

The apparatus includes means for producing a reference frequency signal which is equal to the desired spacing between channels. The apparatus also includes means for producing a displaced reference frequency signal which differs from the reference frequency signal by a predetermined differential frequency. The reference frequency signal is applied to a first harmonic generating means which produces a plurality of harmonics of the reference frequency signal, and the displaced reference frequency signal is applied to a second harmonic generating means which produces a plurality of harmonics of the displaced reference frequency signal.

The apparatus includes a phase-locked loop having a voltage controlled oscillator and a phase detector with a first input coupled to the first harmonic generating means, a second input coupled to the output of the voltage controlled oscillator, and an output coupled to the input of the voltage controlled oscillator. The phase-locked loop operates in a known manner to lock the output of the voltage controlled oscillator to a harmonic of the reference frequency signal. A tuning means is coupled to the input of the voltage controlled oscillator for selectively tuning the voltage controlled oscillator so as to produce an output signal of a particular harmonic of the reference frequency signal.

The outputs of the voltage controlled oscillator and of the second harmonic generating means are applied to a frequency mixing means which mixes the plurality of harmonics of the displaced frequency signal with the particular harmonic of the reference frequency signal. The output of the frequency mixing means is coupled to a filtering means which removes the high frequency components of frequency mixing and passes the particular harmonic of the differential frequency.

The output of the filtering means is applied to a means which provides an indication of the value of the frequency of the signal passed by the filtering means. Since this frequency is the same harmonic of the differential frequency as the harmonic of the reference frequency from the voltage controlled oscillator and since the value of the differential frequency is known, the value of this frequency is a measure of the particular harmonic of the reference frequency, or the specific channel, to which the phase-locked loop is tuned.

In one aspect of the invention the output of the filtering means is applied to an adjustment means. The adjustment means is coupled to the input of the voltage controlled oscillator and operates to change the tuning of the voltage controlled oscillator causing it to produce an output signal of another harmonic of the reference frequency signal when the particular harmonic of the differential frequency from the filtering means differs from a predetermined harmonic. The predetermined harmonic is the harmonic of the reference frequency to which it is intended to tune the phase-locked loop, and the changing of the tuning of the voltage controlled oscillator causes the phase-locked loop to become locked to the predetermined harmonic of the reference frequency.

BRIEF DESCRIPTION OF THE DRAWINGS

Additional objects, features, and advantages of frequency synthesizer apparatus in accordance with the invention will be apparent from the following detailed discussion together with the accompanying drawings wherein.

DETAILED DESCRIPTION OF THE INVENTION

Figure 1:
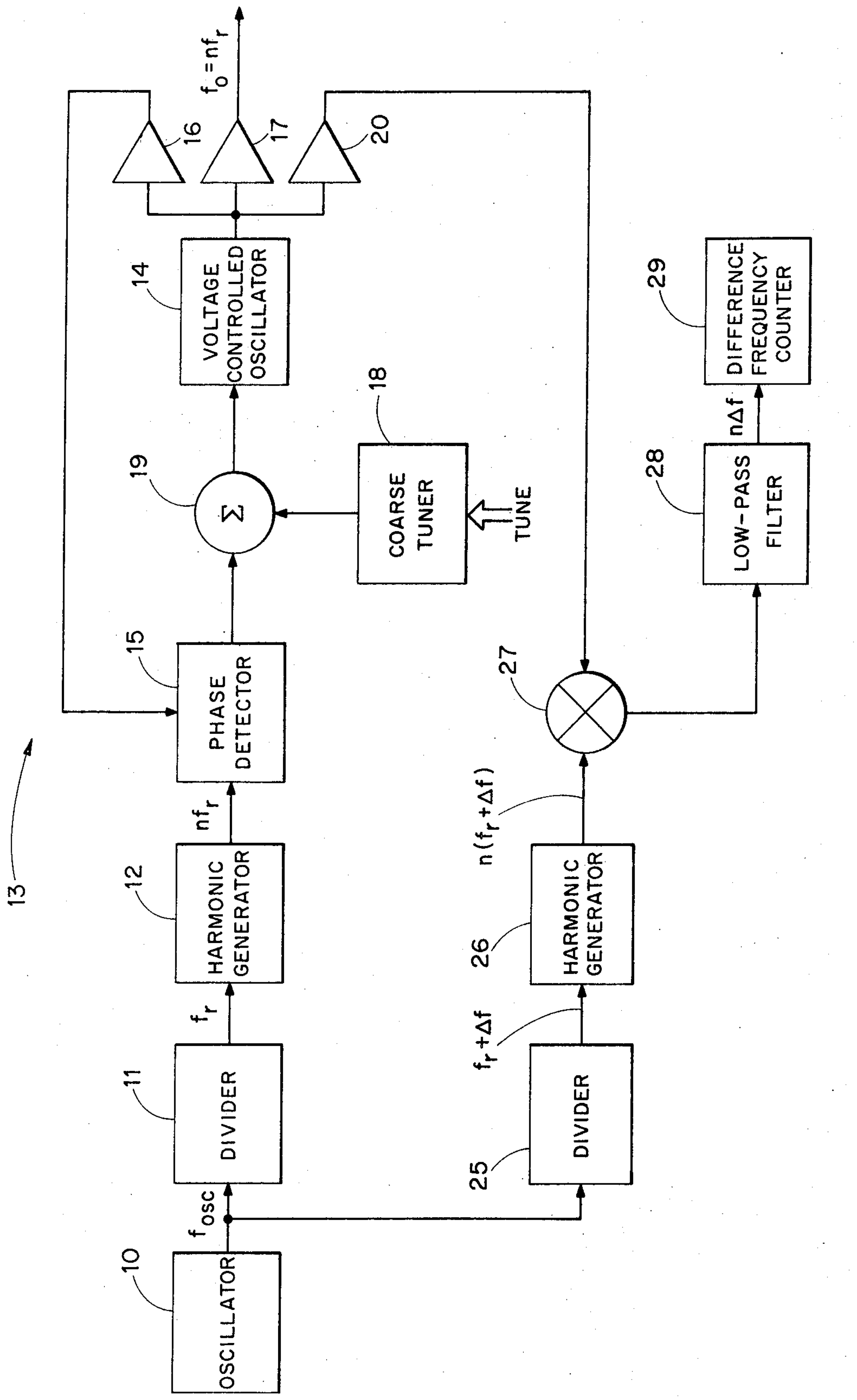
FIG. 1 is a schematic block diagram of a frequency synthesizer in accordance with the present invention.

The frequency synthesizer in accordance with the invention as illustrated in FIG 1. includes a master oscillator 10 which may be a highly stable temperature compensated crystal oscillator. The oscillator output signal $f_{osc}$ is divided by a divider 11 to produce a reference frequency signal $f_r$ equal to the frequency spacing desired between adjacent output frequencies, or channels, of the system. The reference frequency signal $f_r$ is applied to a first harmonic generator 12 which generates a spectrum of output signals which are multiples or harmonics of the input frequency $f_r$.

The spectrum of harmonics is applied to a phase-locked loop 13 of generally known type. The phase-locked loop 13 includes a voltage controlled oscillator 14 which produces an output frequency signal related to its input voltage. The phase-locked loop also includes a phase detector 15 having a first input connected to the output of the harmonic generator 12 and a second input connected to the output of the voltage controlled oscillator 14 through an isolation amplifier 16. The phase-locked loop is coarse tuned by tuning a coarse tuner 18 which applies a voltage to the input of the voltage controlled oscillator through a summing network 19.

The phase-locked loop operates in the conventional manner. The output of the phase detector 15 is an appropriately filtered and amplifier error voltage which is related to the phase and frequency difference between its input signals. When the voltage applied at the input of the voltage controlled oscillator 14 by the coarse tuner 18 causes its output frequency $f_o$ to be sufficiently close to a harmonic of the reference frequency, the error voltage from the phase detector 15 automatically adjusts so as to lock the voltage controlled oscillator 14 to operation at that frequency. In FIG. 1 the particular harmonic of the reference frequency at which the phase-locked loop is operating is designated $nf_r$. The output frequency $f_o = nf_r$ of the phase-locked loop 13 is taken from the output of the voltage controlled oscillator 14 through an isolation amplifier 17.

In accordance with the present invention, a displaced reference frequency is provided which differs from the reference frequency $f_r$ by a predetermined fixed differential frequency $\Delta f$. The differential frequency $\Delta f$ preferably is very small, of the order of a few hertz. The displaced reference frequency signal $f_r + \Delta f$ may be produced, for example, as shown in FIG. 1 by dividing the output frequency signal $f_{osc}$ from the master oscillator 10 in a second divider 25. The resulting displaced frequency signal $f_r + \Delta f$ is applied to a second harmonic generator 26. The spectrum of harmonics generated by the second harmonic generator 26 includes the particular harmonic of the displaced frequency $n(f_r + \Delta f)$ which is the same harmonic of the reference frequency $nf_r$ to which the phase-locked loop 13 is tuned.

The output signals from the second harmonic generator 26, including the particular harmonic of the displaced frequency $n(f_r + \Delta f)$, are applied to the first input of a mixer 27, and the output signal $nf_r$ from the phase-locked loop 13 is applied to the second input of the mixer 27 by way of an isolation amplifier 20. The output of the mixer 27 includes among its components the particular harmonic of the differential frequency $n\Delta f$. The output of the mixer is applied to a low-pass filter 28 which removes high frequency components and passes low frequency components. Specifically, the cutoff frequency of the filter 28 is such that it only passes harmonics of the differential frequency within the range of harmonics used in the system. Thus, the particular harmonic of the differential frequency $n\Delta f$ is the only signal present at the output of the filter.

The signal $n\Delta f$ from the low-pass filter 28 is applied to a suitable frequency indicator, for example, a difference frequency counter 29 which measures the input frequency thus providing a specific value of the particular harmonic of the differential frequency $n\Delta f$. Since the value of the differential frequency $\Delta f$ is always the same, the particular value of n is readily determined, thus providing a precise evaluation of the output frequency $f_o = nf_r$ of the phase-locked loop.

Figure 2:
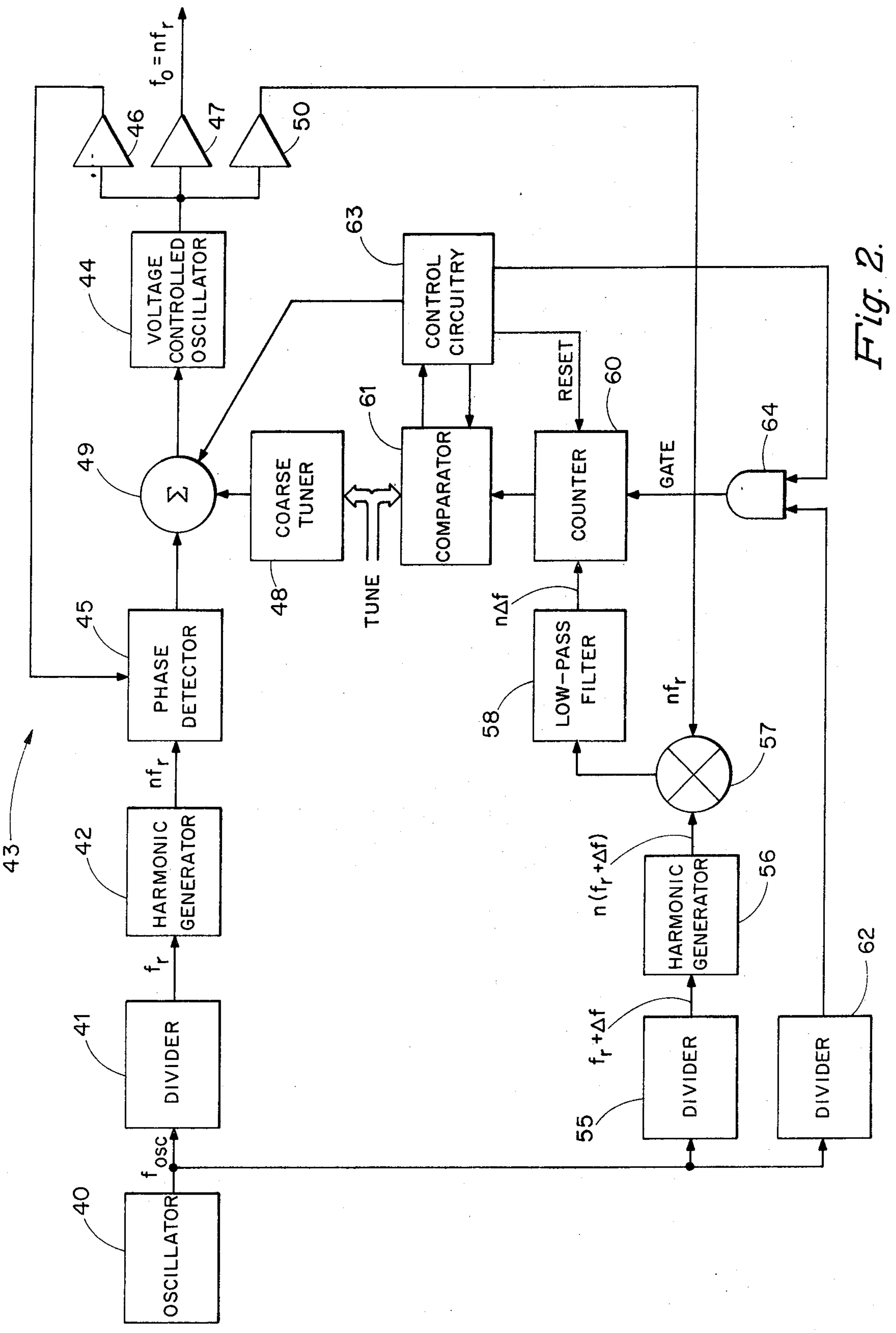
FIG. 2 is a schematic block diagram of an embodiment of a frequency synthesizer in accordance with the invention which includes an arrangement for automatically tuning the phase-locked loop.

FIG. 2 illustrates an embodiment of the apparatus in accordance with the invention in which the output signal of the low-pass filter $n\Delta f$ is compared to a representation of a preset value of a harmonic and which automatically tunes the phase-locked loop to operate at the preset harmonic. The synthesizer of FIG. 2 includes a master oscillator 40, a divider 41, a first harmonic generator 42, and a phase-locked loop 43 having a voltage controlled oscillator 44 and a phase detector 45. A coarse tuner 48 is connected to the input of the voltage controlled oscillator 44 through a summing network 49. The apparatus also includes a second divider 55, a second harmonic generator 56, a mixer 57, a low-pass filter 58, and isolation amplifiers 46, 47, and 50. These elements operate in essentially the same manner as corresponding elements of the apparatus as shown in FIG. 1.

The apparatus of FIG. 2 includes an arrangement for counting the cycles of the signal $n\Delta f$ from the low-pass filter 58, comparing the count with a preset count, and then adjusting the tuning of the phase-locked loop so that its output frequency $f_o$ is equal to the harmonic represented by the preset count. The arrangement includes a counter 60, a comparator 61, and control circuitry 63 which employs known techniques to initiate operation of the counter and comparator and to produce adjusting voltages to the phase-locked loop 43. The counter 60 accumulates a count of the cycles applied at its input from the low-pass filter 58. An accumulated count in the counter 60 is compared with a preset count in the comparator 61 under control of the control circuitry 63. The comparator 61 is selectively preset to a count which represents the value of the harmonic of the reference frequency $f_r$ at which the synthesizer is to operate. The comparator 61 and coarse tuner 48 may be tuned simultaneously. The counter 60 is activated so as to count the number of cycles of the particular harmonic of the differential frequency $n\Delta f$ occurring during a precise period of time. Accurate timing of the counting period may be obtained, for example, by dividing the output frequency signal $f_{osc}$ from the master oscillator 40 by a divider 62 to produce a timing signal having adjacent pulses spaced apart by an interval equal to the counting period. Timing pulses from the divider 62 are gated into the counter 60 when a gate circuit 64 is enabled by the control circuitry 63. A pulse from the divider 62 activates the counter 60 and permits it to start accumulating a count of the cycles in the signal from the low-pass filter 58. The next timing pulse from the divider 62 stops the count.

Comparator 61 compares the accumulated count from the counter 60 with the preset count as set by tuning of the synthesizer. The comparator 61 produces an output signal to the control circuitry 63 indicating whether the accumulated count is equal to, greater than, or less than the preset count. If the counts are equal, the particular harmonic at which the phase-locked loop is operating is the same as the intended harmonic to which the synthesizer is tuned, and the voltage at the input to the voltage controlled oscillator 74 is not changed.

If the accumulated count is greater than the preset count, the particular harmonic of operation is higher than the intended harmonic. Under these circumstances the control circuitry 63 applies a voltage to the summing network 49 which causes the phase-locked loop to unlock from the particular harmonic of operation and to relock at the next lower harmonic. If the accumulated count in the counter 60 is less than the preset count in the comparator 61, the particular harmonic of operation is lower than the intended harmonic, and the control circuitry 63 applies a voltage to the summing network 49 which causes the phase-locked loop to shift to the next higher harmonic.

Thus, the output frequency signal $f_o$ of the phase-locked loop 43 is changed to the next harmonic of the reference frequency toward the intended harmonic as preset by tuning. The control circuitry 63 then resets the counter 60. The adjustment procedure is repeated, if necessary, until the accumulated count is equal to the preset count. The control circuitry 63 may be actuated manually to initiate each adjustment procedure or may operate automatically, either continuously or periodically, in order to tune the synthesizer to the intended operating channel and to ensure continuous proper operation.

Figure 3:
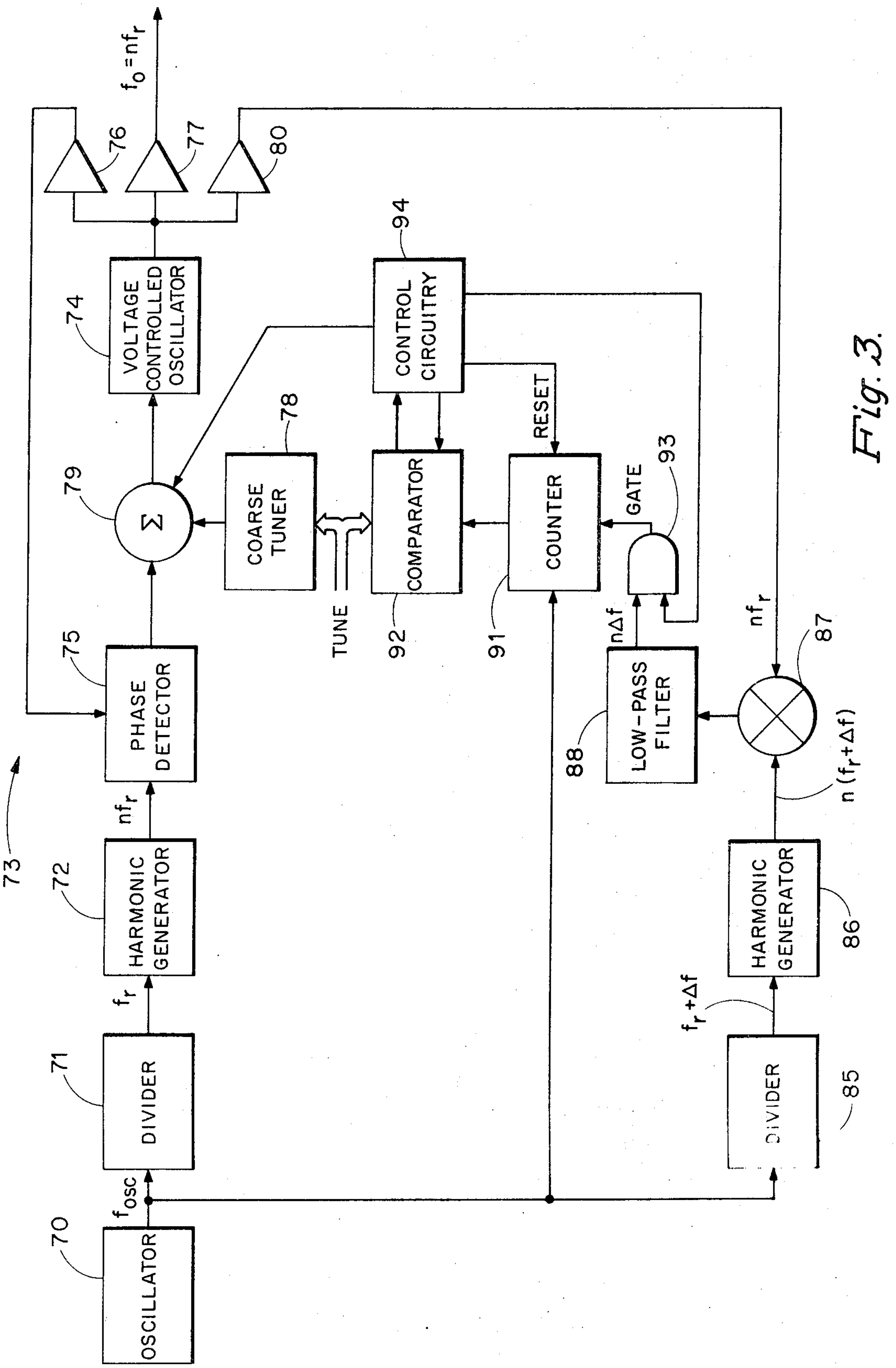
FIG. 3 is a schematic block diagram of another embodiment of a frequency synthesizer in accordance with the invention which includes a different arrangement for automatically tuning the phase-locked loop.

FIG. 3 illustrates another embodiment of the invention in which the particular harmonic of the differential frequency $n\Delta f$ is compared with a representation of a preset harmonic and a tuning signal is generated to change the harmonic toward the preset value. The apparatus includes a master oscillator 70, a first divider 71, a first harmonic generator 72, and a phase-locked loop 73 having a phase detector 75 and a voltage controlled oscillator 74. The apparatus also includes isolation amplifiers 76, 77, and 80 and a coarse tuner 78, a summing network 79, a second divider 85, a second harmonic generator 86, a mixer 87, and a low-pass filter 88. These elements correspond to similar elements in the embodiments illustrated in FIGS. 1 and 2 and operate in the manner as described.

In the apparatus of FIG. 3 the number of cycles of a known high frequency signal are counted for a period of time related to the particular harmonic of the differential frequency $n\Delta f$. The accumulated count is compared with a preset count, which is a representation of the intended harmonic of operation of the synthesizer, in order to determine whether the particular operating harmonic is equal to, greater than, or less than the intended harmonic. The master oscillator 70 may readily serve as the source of the high frequency signal. The output signal of the master oscillator 70 is applied to the input of a counter 91.

The counter 91 is activated to accumulate a count of the cycles from the oscillator 70 during a single cycle of the particular differential frequency $n\Delta f$ from the low-pass filter 88. When a gate circuit 93 is enabled by a signal from control circuitry 94, a pulse from the low-pass filter 88 causes the counter 91 to start counting input pulses from the master oscillator 70. The next pulse from the low-pass filter 88 stops the counting. The count accumulated between pulses from the low-pass filter 88 is a measure of the particular harmonic of the differential frequency $n\Delta f$.

The count accumulated in the counter 91 during one period of the particular harmonic of the differential frequency $n\Delta f$ is compared with a preset count in a comparator 92. In the event of a difference, a suitable output signal is produced to the control circuitry 94 causing the control circuitry 94 to provide an appropriate adjusting voltage to the summing network 79 so as to increase or decrease the voltage at the input of the voltage controlled oscillator 74. The phase-locked loop 73 is thus caused to lock into operation at the next higher or next lower harmonic of the reference frequency. The control circuit 94 then causes the counter 91 to be reset in preparation for repeating the procedure. The procedure is repeated until the accumulated count equals the preset count and the phase-locked loop is operating at the harmonic of the reference frequency as set in the comparator 92.

Apparatus in accordance with the invention as shown and described hereinabove employs a displaced spectrum of the harmonics of the reference frequency to obtain a precise determination of the operating frequency, or channel, of a frequency synthesizer. The apparatus may also include an arrangement which provides automatic acquisition and correction to ensure operation at the intended frequency. Therefore, accurate control of coarse tuning and precise initial acquisition are not important. Frequency synthesizer apparatus in accordance with the invention as described herein advantageously may be employed in channelized communication equipment of various types in which an accurately predetermined frequency of operation on a multiplicity of channels is desired.

Thus, while there has been shown and described what are considered preferred embodiments of the present invention, it will be obvious to those skilled in the art that various changes and modifications may be made therein without departing from the invention as defined by the appended claims.

What is claimed is:

1. Frequency synthesizer apparatus including in combination means for producing a reference frequency signal;

means for producing a displaced reference frequency signal differing from the reference frequency signal by a predetermined differential frequency;

first harmonic generating means coupled to the means for producing the reference frequency signal for producing a plurality of harmonics of the reference frequency signal;

second harmonic generating means coupled to the means for producing the displaced reference frequency signal for producing a plurality of harmonics of the displaced reference frequency signal;

a voltage controlled oscillator;

phase detector means having a first input coupled to the first harmonic generating means, a second input coupled to the output of the voltage controlled oscillator, and an output coupled to the input of the voltage controlled oscillator to provide a phase-locked loop, whereby the frequency of the output signal of the voltage controlled oscillator is equal to a harmonic of the reference frequency signal;

tuning means coupled to the input of the voltage controlled oscillator for selectively tuning the voltage controlled oscillator to produce an output signal of a particular harmonic of the reference frequency signal;

frequency mixing means coupled to the second harmonic generating means and to the output of the voltage controlled oscillator for frequency mixing the plurality of harmonics of the displaced frequency signal with the particular harmonic of the reference frequency signal from the voltage controlled oscillator;

filtering means coupled to the output of the frequency mixing means for removing the high frequency components of frequency mixing and passing the particular harmonic of the differential frequency; and means coupled to the filtering means for providing an indication of the value of the frequency of the signal passed by the filtering means.

2. Frequency synthesizer apparatus in accordance with claim 1 including oscillator means for producing an oscillator frequency signal;

first frequency reducing means coupled to the oscillator means and operable to produce said reference frequency signal; and second frequency reducing means coupled to the oscillator means and operable to produce said displaced reference frequency signal.

3. Frequency synthesizer apparatus including in combination means for producing a reference frequency signal;

means for producing a displaced reference frequency signal differing from the reference frequency signal by a predetermined differential frequency;

first harmonic generating means coupled to the means for producing the reference frequency signal for producing a plurality of harmonics of the reference frequency signal;

second harmonic generating means coupled to the means for producing the displaced reference frequency signal for producing a plurality of harmonics of the displaced reference signal;

a voltage controlled oscillator;

phase detector means having a first input coupled to the first harmonic generating means, a second input coupled to the output of the voltage controlled oscillator, and an output coupled to the input of the voltage controlled oscillator to provide a phase-locked loop, whereby the frequency of the output signal of the voltage controlled oscillator is equal to a harmonic of the reference frequency signal;

tuning means coupled to the input of the voltage controlled oscillator for selectively tuning the voltage controlled oscillator to produce an output signal of a particular harmonic of the reference frequency signal;

frequency mixing means coupled to the second harmonic generating means and to the output of the voltage controlled oscillator for frequency mixing the plurality of harmonics of the displaced frequency signal with the particular harmonic of the reference frequency signal from the voltage controlled oscillator;

filtering means coupled to the output of the frequency mixing means for removing the high frequency components of frequency mixing and passing the particular harmonic of the differential frequency; and adjustment means coupled to the filtering means and to the input of the voltage controlled oscillator and operable to change the tuning of the voltage controlled oscillator to produce an output signal of another harmonic of the reference frequency signal when the particular harmonic of the differential frequency from the filtering means differs from a predetermined harmonic.

4. Frequency synthesizer apparatus in accordance with claim 3 wherein said adjustment means includes means for selectively setting the value of the predetermined harmonic; and means for comparing a representation of the value of the predetermined harmonic with a representation of the value of the particular harmonic of the differential frequency and operable to produce an output voltage to the input of the voltage controlled oscillator for changing the value of the harmonic of the reference frequency produced by the voltage controlled oscillator toward the value of the predetermined harmonic when the particular harmonic differs from the predetermined harmonic.

5. Frequency synthesizer apparatus in accordance with claim 4 including oscillator means for producing an oscillator frequency signal;

first frequency reducing means coupled to the oscillator means and operable to produce said reference frequency signal; and second frequency reducing means coupled to the oscillator means and operable to produce said displaced reference frequency signal.

6. Frequency synthesizer apparatus in accordance with claim 3 wherein said adjustment means includes counter means coupled to said filtering means and operable to count the cycles of an input signal;

timing means coupled to said counter means and operable to activate the counter means for a period, whereby the counter means accumulates a count of the cycles of the harmonic of the differential frequency from the faltering means occuring during said period;

comparator means coupled to said counter means and operable to be selectively set to a representation of the count of cycles occurring during said period for a predetermined harmonic of the differential frequency, said comparator means being operable to compare a count of cycles occurring during said period and accumulated within said counter means with the representation set in the comparator means, and to produce an output signal indicating whether the accumulated count is equal to, greater than, or less than the representation; and voltage control means coupled to the comparator means and to the input of the voltage controlled oscillator and operable in response to an output signal from the comparator means to adjust the voltage level at the input of the voltage controlled oscillator so as to change the harmonic of the reference frequency signal produced by the voltage controlled oscillator toward the predetermined harmonic.

7. Frequency synthesizer apparatus in accordance with claim 6 including oscillator means for producing an oscillator frequency signal;

first frequency reducing means coupled to the oscillator means and operable to produce said reference frequency signal; and second frequency reducing means coupled to the oscillator means and operable to produce said displaced reference frequency signal.

8. Frequency synthesizer apparatus in accordance with claim 3 wherein said adjustment means includes counting means operable to count the cycles of an input signal;

means for producing a standard frequency signal coupled to the input of said counting means;

means coupled to said filtering means and said counting means and operable to activate the counting means for a pre-established number of cycles of the harmonic of the differential frequency signal from the filtering means, whereby the counting means accumulates a count of the cycles of the standard frequency signal occurring during said pre-established number of cycles;

comparing means coupled to said counting means and operable to be selectively set to a representation of the count of cycles of the standard frequency signal occurring during said pre-established number of cycles of a predetermined harmonic of the differential frequency, said comparing means being operable to compare a count of cycles occurring during said pre-established number of cycles of the particular harmonic of the differential frequency and accumulated within said counting means with the representation set in the comparing means, and to produce an output signal indicating whether the accumulated count is equal to, greater than, or less than the representation; and voltage adjusting means coupled to the comparing means and to the input of the voltage controlled oscillator and operable in response to an output signal from the comparing means to adjust the voltage level at the input of the voltage controlled oscillator to change the harmonic of the reference frequency signal produced by the voltage controlled oscillator toward the predetermined harmonic.

9. Frequency synthesizer apparatus in accordance with claim 8 including oscillator means for producing an oscillator frequency signal;

first frequency reducing means coupled to the oscillator means and operable to produce said reference frequency signal; and second frequency reducing means coupled to the oscillator means and operable to produce said displaced reference frequency signal.

* * * * *